United States Patent [19]

Daniel

[11] 4,123,732
[45] Oct. 31, 1978

[54] METHOD OF MAKING TUNED RESONANCE PASSIVE ELECTRONIC FILTERS

[75] Inventor: Richard A. Daniel, Kingston, Wash.

[73] Assignee: The United States of America as represented by the Secretary of the Navy, Washington, D.C.

[21] Appl. No.: 764,482

[22] Filed: Jan. 31, 1977

[51] Int. Cl.$^2$ .......................... H03H 7/10; H03H 7/14
[52] U.S. Cl. .................................... 333/70 R; 333/76
[58] Field of Search .................. 333/70 R, 76, 78, 79, 333/77, 73 R, 73 W, 82 R, 83 R; 324/78 F, 57 Q, 81

[56] References Cited

U.S. PATENT DOCUMENTS

| 1,977,435 | 10/1934 | Farnham | 333/70 R |
| 3,794,938 | 2/1974 | Boelter | 333/70 R |

OTHER PUBLICATIONS

Scowen–"An Introduction to the Theory and Design of Electric Wave Filters," Chapman & Hall, London, 1950; Title page and pp. 152–157.

Primary Examiner—Alfred E. Smith
Assistant Examiner—Marvin Nussbaum
Attorney, Agent, or Firm—R. S. Sciascia; Charles D. B. Curry

[57] ABSTRACT

A method for making tuned resonance passive electronic filters. The method consists of computing the values of the filter components and then using standard unmatched components that approximate the computed values in conjunction with certain components that are made variable for the purpose of tuning out the unmatched characteristics of the unmatched components. A typical filter may include several poles where each pole includes an unmatched component, such as a capacitor, and a variable component such as an inductor. Adjacent poles may be coupled by unmatched or variable inductors or capacitors. Each pole is tuned for resonance by applying the output of a signal generator to a particular pole, while shorting adjacent poles, and tuning the variable component of that pole for resonance. Resonance may be indicated by a null on an a.c. voltmeter connected to measure pole.

4 Claims, 5 Drawing Figures

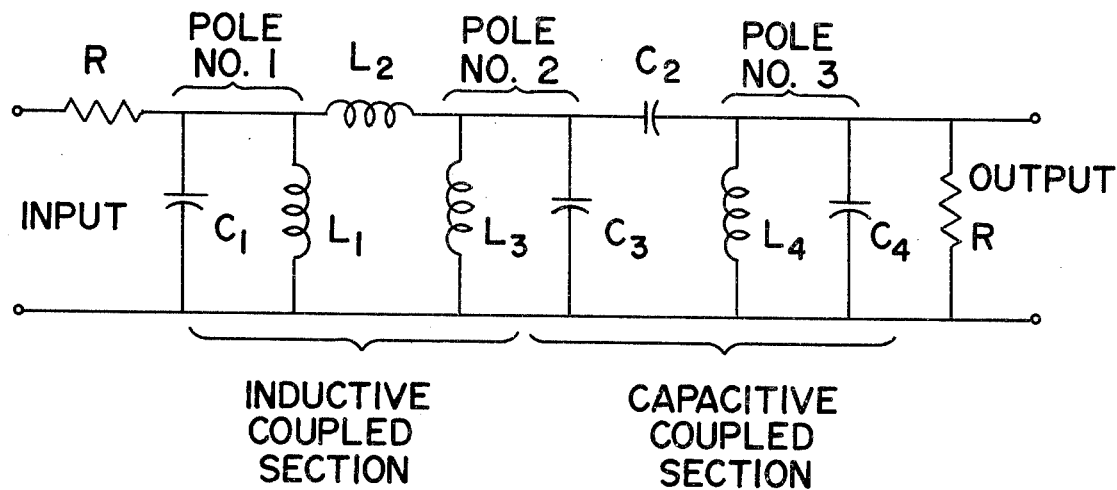
FIG_1
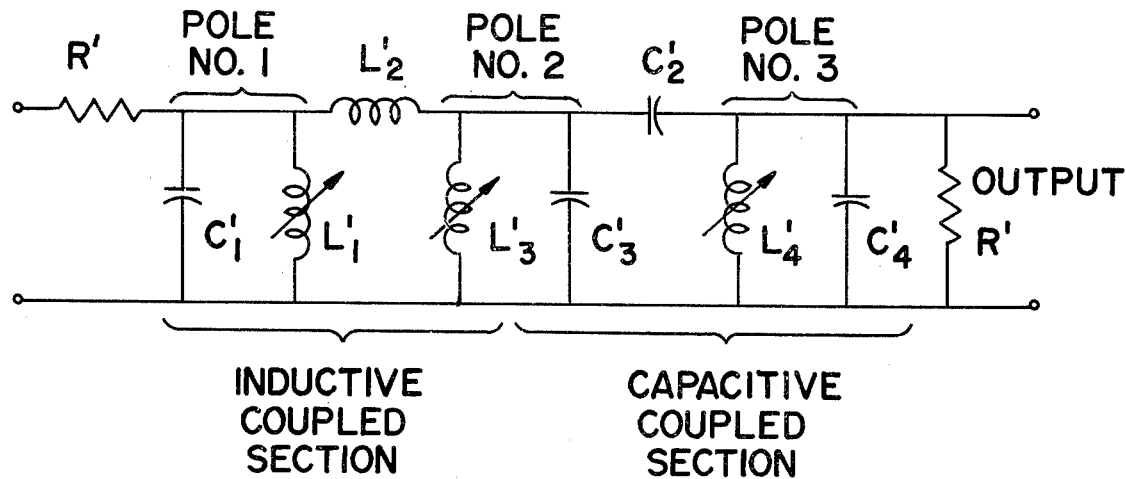
FIG_2  TWO-SECTION (3-POLE) FILTER MADE BY THE METHOD OF FIGS. 3, 4 AND 5
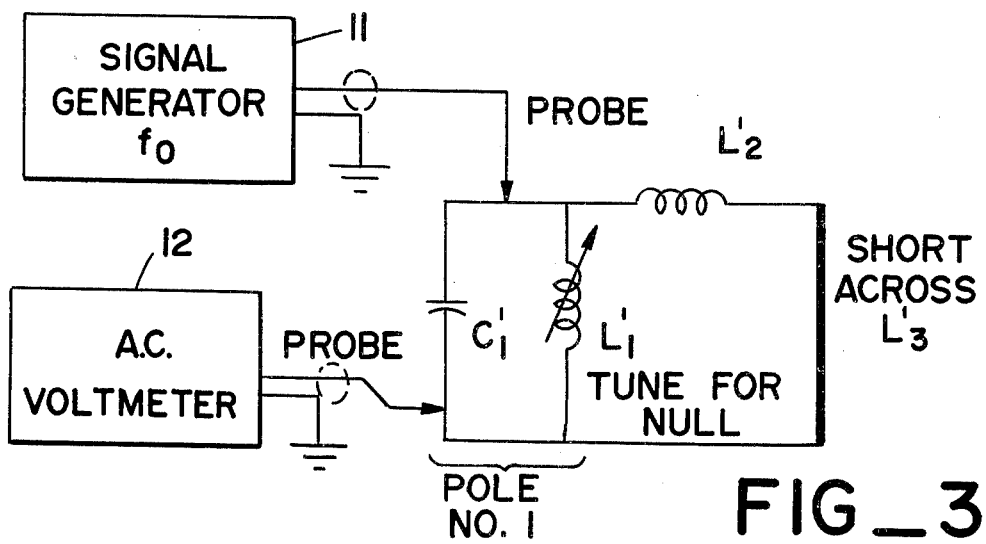
FIG_3

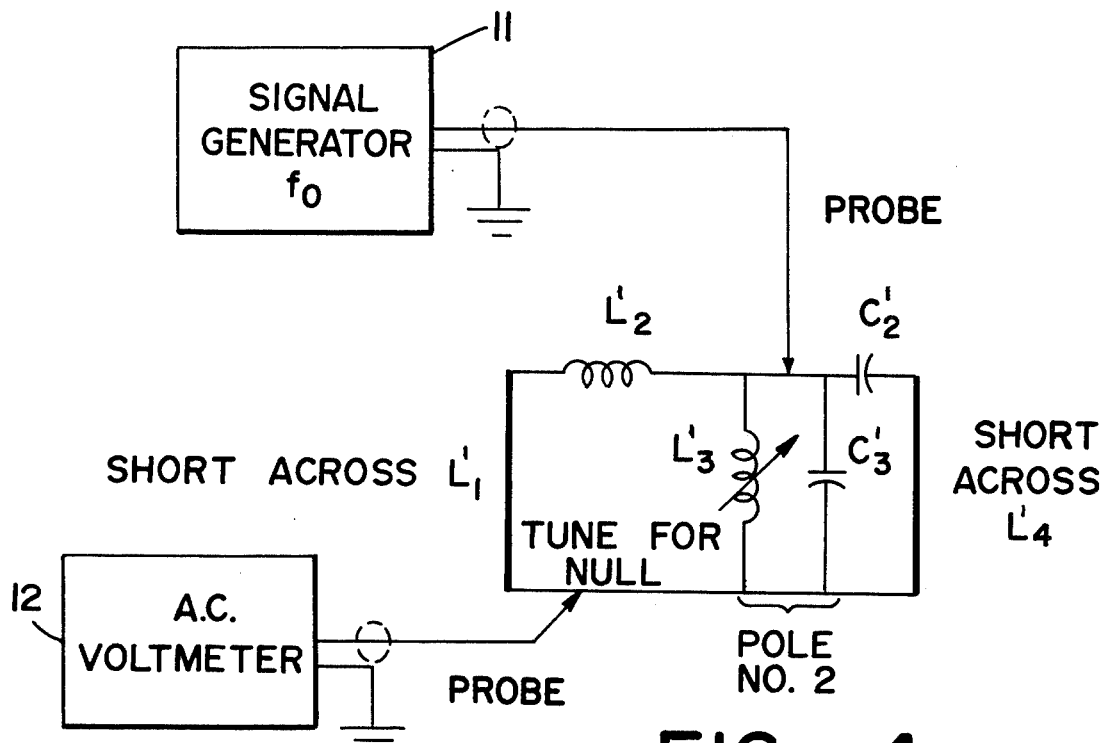
FIG_4
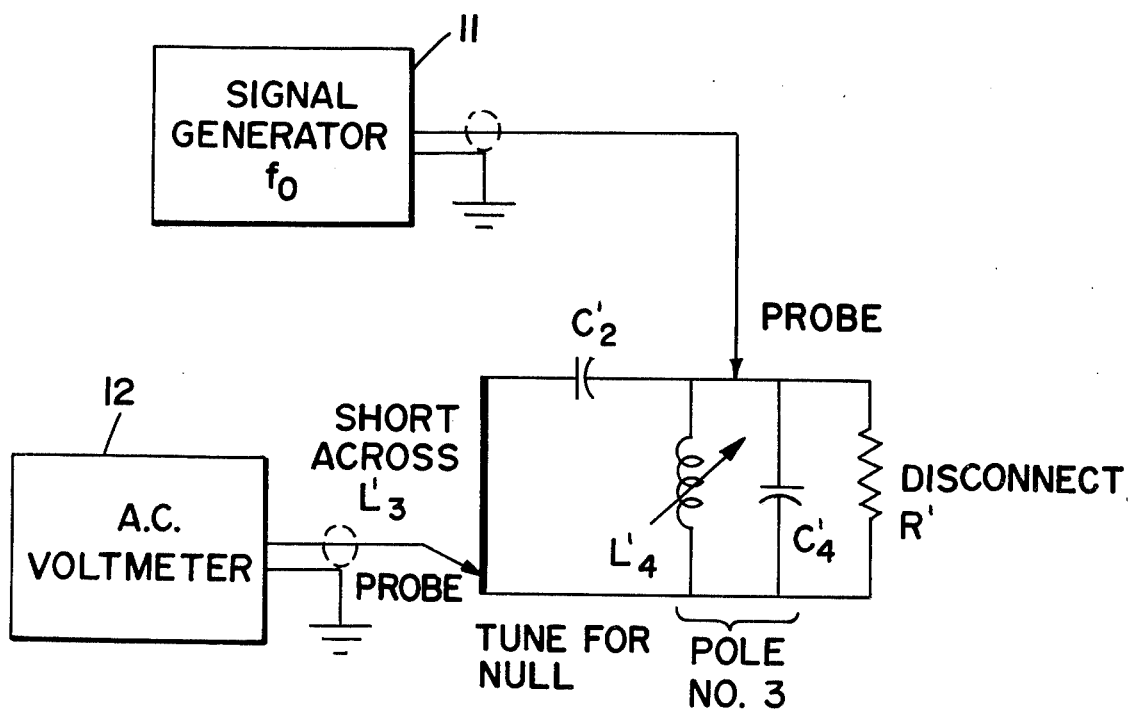
FIG_5

METHOD OF MAKING TUNED RESONANCE PASSIVE ELECTRONIC FILTERS

BACKGROUND OF THE INVENTION

1. Field of the Invention

The present invention relates to electronic filters and more particularly to the method of making tuned resonance electronic filters.

2. Description of the Prior Art

One method of making precision passive electronic filter circuits has been to compute the values of the various components to give the desired operating characteristics and then use components having the exact computed values. This is a very time consuming and expensive process in that it requires the selection of each component from a batch of components to "match" the computed value. Another tuning method has been the use of a sweep frequency oscillator and oscilloscope to observe pass band characteristics while tuning. Interaction of adjustments makes this method very time consuming and difficult to use for the manufacture of multi-pole filters.

The difficulties have been overcome by the present invention by providing a method of making precision passive electronic filters with standard unmatched components whereby certain unmatched components are made variable for the purpose of tuning-out the undesirable characteristics of other unmatched components.

SUMMARY OF THE INVENTION

Briefly, the present invention comprises a method for making tuned resonance passive electronic filters. The method consists of computing the values of the filter components and then using standard unmatched components that approximate the computed values in conjunction with certain components that are made variable for the purpose of tuning out the unmatched characteristics of the unmatched components. A typical filter may include several poles where each pole includes an unmatched component, such as a capacitor, and a variable component such as an inductor. Adjacent poles may be coupled by unmatched inductors or capacitors. Each pole is tuned for resonance by applying the output of a signal generator to a particular pole, while shorting adjacent poles, and tuning the variable component of that pole for resonance. Resonance may be indicated by a null on an a.c. voltmeter connected to measure signal strength at the pole.

STATEMENT OF THE OBJECTS OF THE INVENTION

An object of the present invention is to provide a highly effective and relatively inexpensive method for making passive electronic band pass filters.

Another object of the present invention is to provide a method for very accurately tuning passive electronic filters of the band pass type.

Still another object of the present invention is to provide a method of making precisely tuned electronic filters without the necessity of using precision components having values that are matched to the computed values.

A still further object of the present invention is to provide a method for making precisely tuned electronic filters whereby certain components are made variable for the purpose of tuning-out the tolerances of other components.

Other objects, advantages and novel features of the invention will become apparent from the following detailed description of the invention when considered in conjunction with the accompanying drawings wherein:

BRIEF DESCRIPTION OF THE DRAWINGS

FIG. 1 is a typical two section (3-pole) filter that may be made by the method of the present invention;

FIG. 2 is the two section (3-pole) filter of FIG. 1 that is made by the method of the present invention; and FIG. 3 is the method for tuning the first pole of the filter of FIG. 2.

FIG. 4 is the method for tuning the second pole of the filter of FIG. 2; and

FIG. 5 is the method for tuning the third pole of the filter of FIG. 2.

DESCRIPTION OF THE PREFERRED EMBODIMENT

In FIG. 1 is shown a typical two-section (3-pole) filter having pole No. 1 that includes parallel connected capacitor $C_1$ and inductor $L_1$, pole No. 2 that includes parallel connected inductor $L_3$ and capacitor $C_3$ and pole No. 3 that includes parallel connected inductor $L_4$ and capacitor $C_4$. The input is connected through resistor R, pole No. 1 is inductively coupled to pole No. 2 by inductor $L_2$, pole No. 2 is capacitively coupled to pole No. 3 by capacitor $C_2$ and resistor R is connected across the output. The normal method for making a precision passive electronic filter of the type shown in FIG. 1 has been to compute the values of the various components to give the desired operating characteristics and then use components having the exact computed values. This is a very time consuming and expensive process in that it requires the selection of each component from a batch of components to "match" the computed value. The purpose of the present invention is to eliminate the process of selecting "matched" components and use in its place standard components that approximate the computed values. The standard components of approximate value are then used in conjunction with certain components that are made variable for the purpose of tuning-out the undesirable characteristics of the unmatched components in accordance with the method of the present invention.

In FIG. 2 is illustrated a two-section (3-pole) filter that is similar to the one shown in FIG. 1. However, the FIG. 2 circuit is different in that inductors $L_1$, $L_3$ and $L_4$ are made variable and are denoted as $L'_1$, $L'_2$ and $L'_4$. In addition, resistors R, matched capacitors $C_1$, $C_2$, $C_3$ and $C_4$ and matched inductor $L_2$ of FIG. 1 are standard unmatched capacitors and inductor that only approximate their computed values and are denoted in FIG. 2 as $C'_1$, $C'_2$, $C'_3$, $C'_4$ and $L'_2$.

The computed values of the components used in FIGS. 1 and 2 are the same and may be determined by standard mathematical techniques or by the following discovered technique. It has been found that the use of the following equations will produce a filter having a response similar to "Butterworth", but with more linear phase.

$$C_4 = C_3 = KC_2 \qquad (1)$$

$$C_2 = \frac{1}{W_o R} \qquad (2)$$

$$L_4 = \frac{1}{W_0^2(C_4 + C_2)} \quad (3)$$

$$L_2 = \frac{R}{W_0} \quad (4)$$

$$L_3 = L_1 = \frac{L_2}{K} \quad (5)$$

$$C_1 = \frac{1}{W_0^2}\left(\frac{1}{L_2} + \frac{1}{L_3}\right) \approx C_2 + C_3 \quad (6)$$

$$K = 1.17\frac{f_0}{\Delta f} \quad (7)$$

Where:
$W_O$ is center angular frequency = $(2\pi f_o)$
$f_o$ is in hertz
$\Delta f$ is 3 dB bandwidth
C is in farads
L is in henries
R is in ohms Component values thus determined should be considered approximate and the nearest available values may be adequate, depending upon the adjustment range of the variable components. An important consideration is that the filter bandwidth is controlled by the ratio of the coupling element ($L_2$ or $C_2$) to its like shunt component as shown in equation (8) below.

$$\frac{L_2}{L_1} = \frac{C_4}{C_2} = 1.17\frac{W_0}{\Delta W} \quad (8)$$

As a practical matter, small slug-tuned inductors, used for all of the inductances, with fixed capacitors, have produced excellent results.

In FIGS. 3, 4, and 5 is illustrated the method of making the filter shown in FIG. 2, using variable and unmatched components, having the same precise characteristics as the filter shown in FIG. 1 using matched components. In FIG. 3 is shown the method for tuning pole No. 1. This is achieved by providing a short across $L'_3$, applying the output from signal generator 11, having a center frequency $f_o$, to one side of capacitor $C'_1$ and one end of variable inductor $L'_1$ and connecting the input to a.c. voltmeter 12 to the other side of capacitor $C'_1$ and to the other end of variable inductor $L'_1$. Then pole No. 1 is tuned to resonance by adjusting variable inductor $L'_1$ which is indicated by a null on a.c. voltmeter 12.

In FIG. 4 is illustrated the method for tuning pole No. 2. This is achieved by providing a short across $L'_1$ and a short across $L'_4$. Then the output from signal generator 11, having a center frequency $f_o$, is applied to one side of capacitor $C'_3$ and one end of variable inductor $L'_3$ and the input to a.c. voltmeter 12 is connected to the other side of capacitor $C'_3$ and to the other end of variable inductor $L'_3$. Then pole No. 2 is tuned to resonance by adjusting variable inductor $L'_3$ which is indicated by a null on a.c. voltmeter 12.

In FIG. 5 is illustrated the method for tuning pole No. 3. This is achieved by providing a short across $L'_3$ and disconnecting R'. Then the output from signal generator 11, having a center frequency $f_o$, is applied to one side of capacitor $C'_4$ and to one end of inductor $L'_4$ and the input to a.c. voltmeter 12 is connected to the other side of capacitor $C'_4$ and to the other end of variable inductor $L'_4$. Then pole No. 3 is tuned to resonance by adjusting variable inductor $L'_4$ which is indicated by a null on a.c. voltmeter 12.

An example of typical circuit parameters which have been used in the practice of the method of the present invention are as follows:
R' = 1500 ohms
$C'_1$ = 5520 pf (may use 4700 in parallel with 820)
$C'_2$ = 1420 pf (may use 1200 in parallel with 220)
$C'_3$ = 4120 pf (may use 3900 in parallel with 220)
$C'_4$ = 4120 pf (may use 3900 in parallel with 220)
$L'_1$ = 1.087 mhy (may use 1 mhy variable)
$L'_2$ = 3.18 mhy (may use 3.3 mhy variable)
$L'_3$ = 1.087 mhy (may use 1 mhy variable)
$L'_4$ = 0.810 mhy (may use 0.820 mhy variable, or 1 mhy variable in parallel with 3.3 mhy fixed)
$f_o$ = 75 KHZ
$\Delta f$ = 30 KHZ From this it can be seen that each pole is tuned for resonance, indicated by a null on the a.c. voltmeter. Filters containing any number of poles may be tuned one pole at a time, by shorting adjacent poles and tuning as previously shown and described.

It has been found that capacitors $C'_1$, $C'_3$, and $C'_4$ could be made variable in place of inductors $L'_1$, $L'_3$, and $L'_4$ being made variable. The tuning method for the poles will remain the same.

Filters of the type described may not require a precise bandwidth and therefore the values of inductor $L'_2$ and capacitor $C'_2$ may be fixed. However, if it is desired that the upper and lower cut-off frequencies be made precise, then capacitor $C'_2$ and inductor $L'_2$ should be made variable. It should be noted that inductor $L'_2$ determines the high frequency band point and capacitor $C'_2$ determines the low frequency band point. In these situations and when it is desired to change the band point after the poles have been adjusted, then either or both of capacitor $C'_2$ or inductor $L'_2$ may be adjusted and the poles returned. It should be noted that an increase of $L'_2$ causes a decrease in bandwidth, affecting primarily the high side frequency. Likewise, a change of capacitive coupling $C'_2$ has an opposite effect on the low frequency side.

What is claimed is:

1. The method of making a tuned resonance passive electronic filter that includes at least first and second electrically connected poles wherein each pole includes first and second components connected in parallel and adjacent poles are coupled by coupling means comprising the steps of:
   (a) selecting each of said first components of said electrically connected poles to be a standard unmatched component that approximates the computed value of that component;
   (b) selecting each of said second components of said electrically connected poles to be variable components that have a predetermined variable range on each side of the computed value of that component; and
   (c) tuning each of said electrically connected poles separately by applying an a.c. resonant frequency signal to each preselected pole, while shorting adjacent poles, and tuning the variable second component of each preselected pole to resonance as indicated by the null in the a.c. voltage of each preselected pole.
2. The method of claim 1 wherein:
   (a) each of said first components is a capacitor and each of said second components is an inductor.
3. The method of claim 1 wherein:

(a) each of said first components is an inductor and each of said second components is a capacitor.

4. The method of claim 1 wherein:

(a) said filter includes first, second, and third poles and said coupling means includes a standard unmatched adjustable coupling inductor that approximates the computed value of that component and a standard unmatched adjustable coupling capacitor that approximates the computed value of that component, said adjustable coupling inductor determining the high frequency band point of said filter and said adjustable coupling capacitor determining the low frequency band point of said filter; and (b) said coupling inductor couples said first and second poles and said coupling capacitor couples said second and third poles.

* * * * *